(12) United States Patent
Huang et al.

(10) Patent No.: US 11,251,210 B2
(45) Date of Patent: Feb. 15, 2022

(54) PIN DIODES WITH OVER-CURRENT PROTECTION

(71) Applicant: Sensors Unlimited, Inc., Princeton, NJ (US)

(72) Inventors: Wei Huang, Plainsborough, NJ (US); Douglas Stewart Malchow, Lawrence, NJ (US); Michael J. Evans, Yardley, PA (US); John Liobe, New York, NY (US); Wei Zhang, Princeton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 226 days.

(21) Appl. No.: 16/785,065

(22) Filed: Feb. 7, 2020

(65) Prior Publication Data
US 2021/0249455 A1     Aug. 12, 2021

(51) Int. Cl.
*H01L 27/146*     (2006.01)

(52) U.S. Cl.
CPC .. *H01L 27/14603* (2013.01); *H01L 27/14649* (2013.01); *H01L 27/14692* (2013.01)

(58) Field of Classification Search
CPC ......... H01L 27/14603; H01L 27/14649; H01L 27/14692; H01L 27/1462; H01L 27/14636; H01L 27/14638; H01L 27/14667; H01L 27/14674; H01L 27/14694; H01L 27/14634; H01L 27/14605; H01L 27/14689
See application file for complete search history.

(56) References Cited

U.S. PATENT DOCUMENTS

| | | | |
|---|---|---|---|
| 7,972,885 B1 | 7/2011 | Dutta et al. | |
| 8,872,953 B2 * | 10/2014 | Sakano | H01L 27/14614 |
| | | | 348/308 |
| 8,921,856 B2 | 12/2014 | Tang et al. | |
| 9,196,643 B2 * | 11/2015 | Shimotsusa | H01L 27/14634 |
| 9,515,106 B2 | 12/2016 | Taghibakhsh | |
| 2016/0013243 A1 | 1/2016 | O'Rourke et al. | |

FOREIGN PATENT DOCUMENTS

| | | |
|---|---|---|
| WO | 2017/079937 A1 | 5/2017 |
| WO | 2019035252 A1 | 2/2019 |
| WO | 2019131134 A1 | 7/2019 |

OTHER PUBLICATIONS

Extended European Search Report dated Jun. 8, 2021, issued during the proseuction of European Patent Application No. EP 21155751.7.

* cited by examiner

*Primary Examiner* — Seung C Sohn
(74) *Attorney, Agent, or Firm* — Locke Lord LLP; Joshua L. Jones; Scott D. Wofsy

(57) ABSTRACT

A system includes a pixel including a diffusion layer in contact with an absorption layer. A transparent conductive oxide (TCO) is electrically connected to the diffusion layer. An overflow contact is in electrical communication with the TCO. The overflow contact can be spaced apart laterally from the diffusion layer. The pixel can be one of a plurality of similar pixels arranged in a grid pattern, wherein each pixel has a respective overflow contact, forming an overflow contact grid offset from the grid pattern.

20 Claims, 2 Drawing Sheets

PIN DIODES WITH OVER-CURRENT PROTECTION

BACKGROUND

1. Field

The present disclosure relates to diodes, and more particularly to photodiodes such as used in pixels for imaging.

2. Description of Related Art

The lower the dark current of photodiodes in an imaging device, the better is the image quality. Similarly, the higher the sensitivity of photodiodes in imaging devices, the better is the image quality. At high light levels, the excess photons generate high current, which may damage a detector and/or put more stress on the read-out integrated circuit (ROIC).

The conventional techniques have been considered satisfactory for their intended purpose. However, there is an ever present need for improved systems and methods for photodiodes used in imaging devices. This disclosure provides a solution for this need.

SUMMARY

A system includes a pixel including a diffusion layer in contact with an absorption layer. A transparent conductive oxide (TCO) is electrically connected to the diffusion layer. An overflow contact is in electrical communication with the TCO.

The overflow contact can be spaced apart laterally from the diffusion layer. The pixel can be one of a plurality of similar pixels arranged in a grid pattern, wherein each pixel has a respective overflow contact, forming an overflow contact grid offset from the grid pattern. The overflow contact can be metallic. A cap layer can be deposited on the absorption layer opposite a substrate. The cap layer can include InP. A SiNx layer can be deposited over the cap layer. The TCO can be deposited on the SiNx layer, wherein the TCO conforms around the SiNx layer to contact the diffusion layer. At least one additional SiNx layer can be deposited over the TCO, wherein the overflow contact extends through the at least one additional SiNx layer. An anti-reflective layer can be deposited on the substrate opposite the absorption layer. A contact metal can be electrically connected to the diffusion layer, configured to electrically connect the diffusion layer to a read-out integrated circuit (ROIC). The overflow contact can be in electrical communication with the ROIC.

The overflow contact can be electrically isolated from the contact metal, and wherein the TCO is electrically connected to a current Sink of the ROIC. The TCO can include multiple layers of ZnO, TiO2 and/or Indium Tin Oxide (ITO). The absorption layer can include InGaAs, e.g., wherein the pixel is sensitive to illumination in infrared wavelengths. It is also contemplated that the absorption layer can include Si, e.g., wherein the pixel is sensitive to illumination in visible light wavelengths.

A method includes forming a pixel array including a plurality of pixels, each pixel including a diffusion layer in contact with an absorption layer. The method includes forming a respective overflow contact electrically connected with each respective pixel of the plurality of pixels, wherein the overflow contacts follow an overflow contact grid.

The method can include depositing a SiNx layer on a cap layer that is deposited on the absorption layer and depositing a transparent conductive oxide (TCO) on the SiNx layer, wherein the overflow contacts are electrically connected to the TCO. The method can include depositing at least one additional SiNx layer on the TCO.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
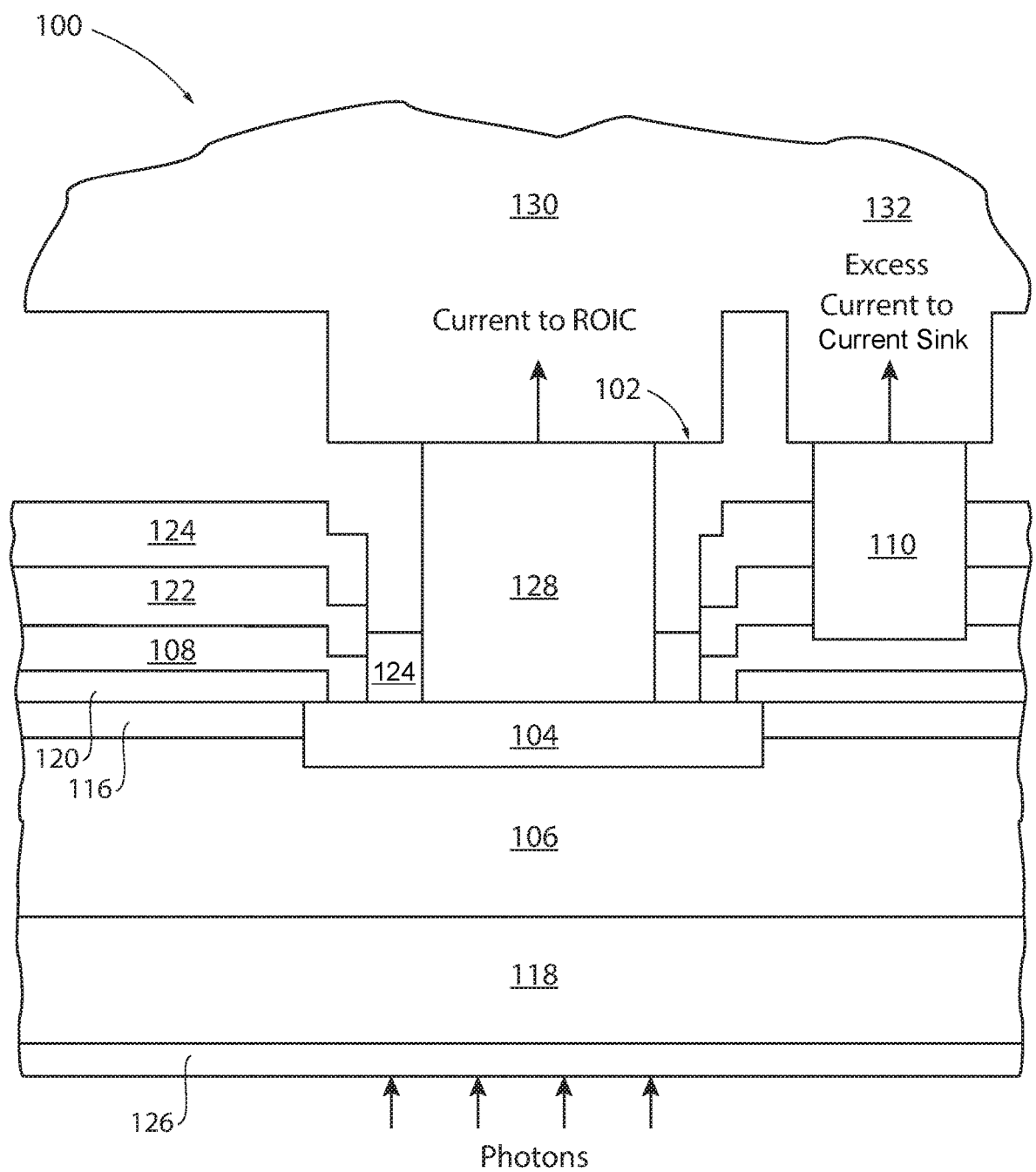
FIG. 1 is a schematic cross-sectional elevation view of an embodiment of a system constructed in accordance with the present disclosure, showing the overflow contact.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIG. 2, as will be described. The systems and methods described herein can be used to reduce excess current, increase sensitivity, and reduce stress on read-out integrated circuits (ROICs) in imaging devices.

A system 100 includes a pixel 102 including a diffusion layer 104 in contact with an absorption layer 106. A transparent conductive oxide (TCO) 108 is electrically connected to the diffusion layer 104. An overflow contact 110 is in electrical communication with the TCO 108. The overflow contact 110 is spaced apart laterally, i.e. in the horizontal direction as oriented in FIG. 1, from the diffusion layer 104.

Figure 2:
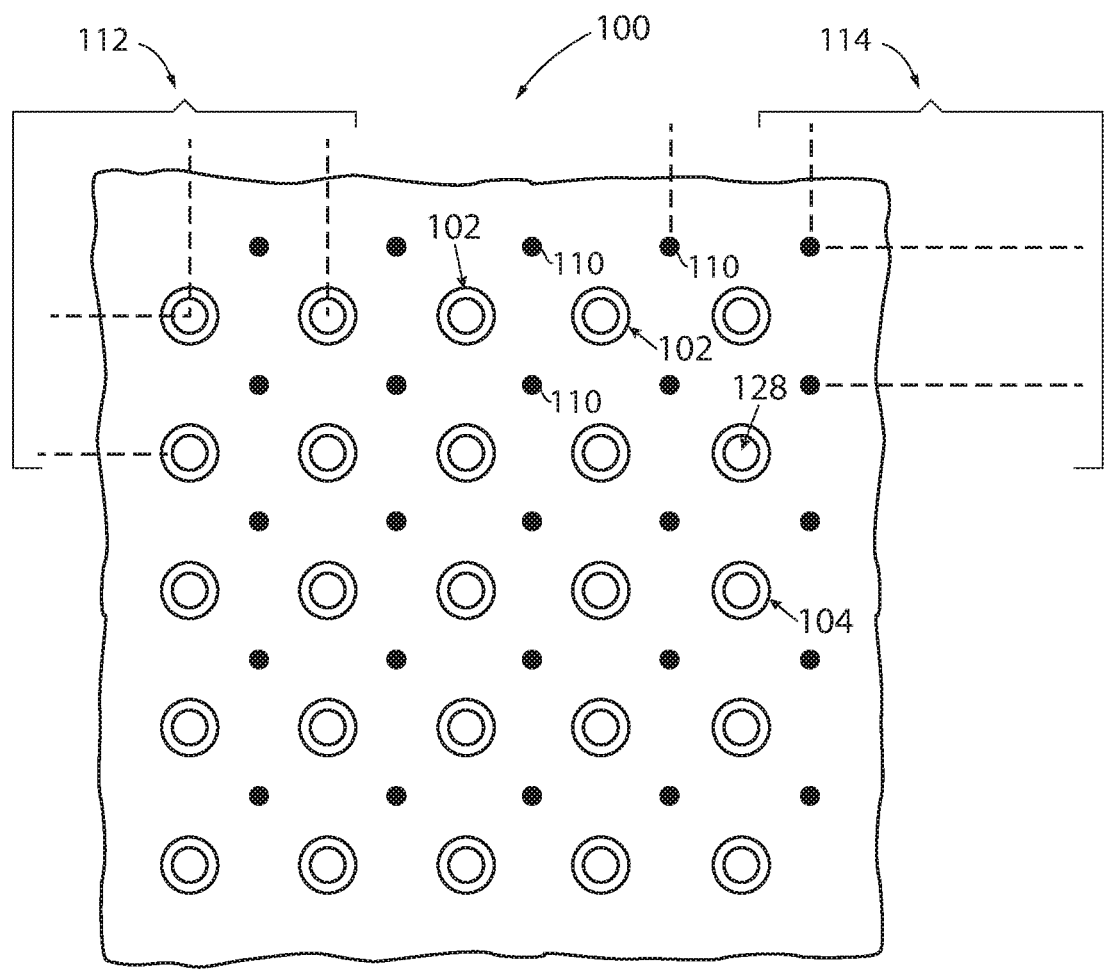
FIG. 2 is a schematic plan view of the system of FIG. 1, showing the grid pattern for a plurality of pixels.

With reference now to FIG. 2, the pixel 102 of FIG. 1 is one of a plurality of similar pixels 102 arranged in a grid pattern 112, indicated with the phantom lines in FIG. 2, wherein each pixel 102 has a respective overflow contact 110, forming an overflow contact grid 114 offset from the grid pattern 112.

With reference again to FIG. 1 a cap layer 116 can be deposited on the absorption layer 106 opposite a substrate 118. The cap layer 116 can include InP. A SiNx layer 120 can be deposited over the cap layer 116. The TCO 108 can be deposited on the SiNx layer 120, wherein the TCO 108 conforms around the SiNx layer 120 to contact the diffusion layer 104 (i.e., the TCO wraps downwardly around the SiNx layer 120 to contact the diffusion layer 104 as oriented in FIG. 1. Two additional SiNx layers 122, 124 are deposited over the TCO 108. The overflow contact 110 extends through the additional SiNx layers 122, 124. An anti-reflective layer 126 can optionally be deposited on the substrate 118 opposite the absorption layer 106. A contact metal 128 is electrically connected to the diffusion layer 104, which electrically connects the diffusion layer 104 to a read-out integrated circuit (ROIC) 130. The overflow contact 110 is electrically connected to the ROIC 130.

The TCO 108 normally acts as an insulator, but when current reaches a predetermined maximum level, the resistance barrier of the TCO 108 breaks and excess current can flow through the TCO 108 to a common current Sink 132 on the ROIC 130. The film resistivity of the TCO 108 can be designed based on detector working conditions, which can be implemented by adjusting the doping level of the TCO 108. The overflow contact 110 can be metallic and is electrically isolated from the contact metal 128. The TCO 108 can include multiple layers of ZnO, TiO2 and/or Indium Tin Oxide (ITO).

The absorption layer 106 can include InGaAs, e.g., wherein the pixel 102 is sensitive to illumination in infrared wavelengths. It is also contemplated that the absorption layer 106 can include Si, e.g., wherein the pixel 102 is sensitive to illumination in visible light wavelengths. Those skilled in the art will readily appreciate that any other suitable material can be used to provide sensitivity in any other suitable wavelengths.

A method includes forming a pixel array (e.g. the array of pixels 102 of the square tiled grid pattern 112 in FIG. 2) including a plurality of pixels. Each pixel includes a diffusion layer, e.g. diffusion layer 104, in contact with an absorption layer, e.g. absorption layer 106. The method includes forming a respective overflow contact, e.g. overflow contact 110, electrically connected with each respective pixel of the plurality of pixels, wherein the overflow contacts follow an overflow contact grid, e.g. the overflow contact grid 114 of FIG. 2.

The method can include depositing a SiNx layer, e.g. SiNx layer 120, on a cap layer, e.g. cap layer 116, that is deposited on the absorption layer and depositing a transparent conductive oxide (TCO), e.g. TCO 108, on the SiNx layer, wherein the overflow contacts are electrically connected to the TCO. The method can include depositing at least one additional SiNx layer, e.g. the additional SiNx layers 122, 124, on the TCO. The diffusion layer 104 is the P portion of a PIN diode, the absorption layer 106 is the I portion of the PIN diode, and the substrate 118 is the N portion of the PIN diode.

The methods and systems of the present disclosure, as described above and shown in the drawings, provide for reduced excess current, increased sensitivity, and reduced stress on read-out integrated circuits (ROICs) in imaging devices. This can improve image quality and can reduce ROIC design requirements and signal processing complications relative to traditional configurations. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
   a pixel including a diffusion layer in contact with an absorption layer;
   a transparent conductive oxide (TCO) electrically connected to the diffusion layer; and
   an overflow contact in electrical communication with the TCO.

2. The system as recited in claim 1, wherein the overflow contact is spaced apart laterally from the diffusion layer.

3. A system as recited in claim 1, wherein the pixel is one of a plurality of similar pixels arranged in a grid pattern, wherein each pixel has a respective overflow contact, forming an overflow contact grid offset from the grid pattern.

4. The system as recited in claim 1, wherein the overflow contact is metallic.

5. The system as recited in claim 1, further comprising a cap layer deposited on the absorption layer opposite a substrate.

6. The system as recited in claim 5, wherein the cap layer includes InP.

7. The system as recited in claim 5, further comprising a SiNx layer over the cap layer.

8. The system as recited in claim 7, wherein the TCO is deposited on the SiNx layer, wherein the TCO conforms around the SiNx layer to contact the diffusion layer.

9. The system as recited in claim 7, further comprising at least one additional SiNx layer deposited over the TCO, wherein the overflow contact extends through the at least one additional SiNx layer.

10. The system as recited in claim 5, further comprising an anti-reflective layer deposited on the substrate opposite the absorption layer.

11. The system as recited in claim 1, further comprising a contact metal electrically connected to the diffusion layer, configured to electrically connect the diffusion layer to a read-out integrated circuit (ROIC).

12. The system as recited in claim 11, further comprising the ROIC connected in electrical communication with the contact metal.

13. The system as recited in claim 12, wherein the overflow contact is in electrical communication with the ROIC.

14. The system as recited in claim 13, wherein the overflow contact is electrically isolated from the contact metal, and wherein the TCO is electrically connected to a current Sink of the ROIC.

15. The system as recited in claim 13, wherein the TCO includes multiple layers of ZnO, TiO2 and/or Indium Tin Oxide (ITO).

16. The system as recited in claim 1, wherein the absorption layer includes InGaAs, and wherein the pixel is sensitive to illumination in infrared wavelengths.

17. The system as recited in claim 1, wherein the absorption layer includes Si, and wherein the pixel is sensitive to illumination in visible light wavelengths.

18. A method comprising:
   forming a pixel array including a plurality of pixels, each pixel including a diffusion layer in contact with an absorption layer; and
   forming a respective overflow contact electrically connected with each respective pixel of the plurality of pixels, wherein the overflow contacts follow an overflow contact grid.

19. The method as recited in claim 18, further comprising:
   depositing a SiNx layer on a cap layer that is deposited on the absorption layer; and
   depositing a transparent conductive oxide (TCO) on the SiNx layer, wherein the overflow contacts are electrically connected to the TCO.

20. The method as recited in claim 19, further comprising depositing at least one additional SiNx layer on the TCO.

* * * * *